(12) United States Patent
Tanaka et al.

(10) Patent No.: US 6,389,382 B1
(45) Date of Patent: May 14, 2002

(54) METHOD FOR SIMULATION OF PIPELINE PROCESSOR USING PASSING OPERATION

(75) Inventors: Ryuta Tanaka; Norichika Kumamoto, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/120,334

(22) Filed: Jul. 22, 1998

(30) Foreign Application Priority Data

Feb. 19, 1998 (JP) .......................................... 10-037720

(51) Int. Cl.[7] .............................................. G06F 9/455
(52) U.S. Cl. .......................................... 703/21; 703/22
(58) Field of Search ............................ 703/14, 15, 16, 703/21, 22; 716/4–6

(56) References Cited

U.S. PATENT DOCUMENTS

| | | | | |
|---|---|---|---|---|
| 5,513,339 A | * | 4/1996 | Agrawal et al. | 703/15 |
| 5,615,357 A | * | 3/1997 | Ball | 703/21 |
| 5,684,724 A | * | 11/1997 | Sutherland | 703/13 |
| 5,794,012 A | * | 8/1998 | Averill | 703/21 |
| 5,815,688 A | * | 9/1998 | Averill | 716/4 |

FOREIGN PATENT DOCUMENTS

| | | |
|---|---|---|
| JP | 3-48365 | 3/1991 |
| JP | 5-53806 | 3/1993 |

OTHER PUBLICATIONS

Burger et al., "The SimpleScalar Tool Set, Version 2.0", University of Wisconsin–Madison Computer Sciences Department Technical Report #1342, Jun. 1997, downloaded from the web at www.cs.wisc.edu/~mscalar/simplescalar.html.*

Jourdan et al., "Exploring Configurations of Functional Units in and Out–of–Order Superscalar Processor", Proc. 22nd Annual International Symposium on Computer Architecture, pp. 117–125, Jun. 1995.*

Klauser et al., "Selective Eager Exectuion on the PolyPath Architecture", Proc. 25th Annual International Symposium on Computer Architecture, pp. 250–259, Jul. 1998.*

Tongsima et al., "Sharp:Efficient Loop Scheduling with Data Hazard Reduction on Multiple Pipeline DSP Systems", Workshop on VLSI Signal Processing, pp. 253–262, Nov. 1996.*

* cited by examiner

Primary Examiner—Russell W. Frejd
(74) Attorney, Agent, or Firm—Staas & Halsey LLP

(57) ABSTRACT

A simulator can simulate a processor which performs pipeline processing of operation instructions, and performs operation processes in parallel, a number of the processes being larger than a number of the pipelines. The simulator simulates a passing operation in which a result of an operation processing obtained from execution of an operation instruction is output earlier than a result of another operation process obtained from previously started execution of another operation instruction, the passing operation occurring due to the number of execution cycles of each operation instruction which is executed in parallel with execution of other operation instructions.

17 Claims, 13 Drawing Sheets

FIG. 8

| INSTRUCTIONS | FIRST CYCLE | SECOND CYCLE | THIRD CYCLE | FOURTH CYCLE |
|---|---|---|---|---|
| ADD | ADDER | NULL | NULL | NULL |
| SUB | ADDER | NULL | NULL | NULL |
| MAC | MULTIPLIER | MULTIPLIER | MULTIPLIER | ADDER |

FIG. 9

| | ADDER | MULTIPLIER | SHIFTER | | GENERAL-PURPOSE REGISTER 1 | GENERAL-PURPOSE REGISTER 2 | | INDEX REGISTER 1 | INDEX REGISTER 2 | |
|---|---|---|---|---|---|---|---|---|---|---|
| CURRENT CYCLE | 1 | 0 | 0 | | 1 | 1 | | 0 | 0 | |
| FIRST SUBSEQUENT CYCLE | 0 | 1 | 1 | | 1 | 0 | | 1 | 0 | |
| SECOND SUBSEQUENT CYCLE | 0 | 0 | 1 | | 0 | 0 | | 1 | 0 | |
| THIRD SUBSEQUENT CYCLE | 1 | 1 | 0 | | 1 | 1 | | 0 | 0 | |

0 : RESOURCE NOT BEING USED
1 : RESOURCE BEING USED

METHOD FOR SIMULATION OF PIPELINE PROCESSOR USING PASSING OPERATION

BACKGROUND OF THE INVENTION

1. Field of the Invention

The present invention relates to a simulator which can simulate a processor which executes pipeline processing of operation instructions, and a simulation method for a processor, using the simulator.

Recently, a processor in a multimedia market can execute real-time processing of video and audio of a dynamic scene as a result of improvement of operation performance. Further, a high-performance application can be formed by a personal computer, a portable terminal or the like.

However, when programming is performed by using a processor having such an operation performance, programming in a high-performance, complicated operation processing system is needed. Therefore, a simulator which can effectively debug a produced program is demanded.

2. Description of the Related Art

In the related art, a simulator does not exist which can simulate a processor which executes pipeline processing of operation instructions, executes operation processes in parallel in an order of inputting of the operation instructions (hereinafter, execution of the operation processes in the order of inputting of the operation instructions being referred to as 'in-order execution'), and outputs results of the operation processes in an order of finish of the operation processes (hereinafter, outputting of the results of the operation processes in the order of finish of the operation processes being referred to as 'out-of-order outputting').

Further, when simulation of an ordinary processor, which performs pipeline processing of operation instructions, and performs in-order execution and in-order outputting, is executed, it is not necessary for a simulator in the related art to perform a simulation exact in the pipeline processing, but, in many cases, a sufficient simulation result can be obtained as a result of a simulation being performed in which single instructions are executed one by one. The above-mentioned 'in-order outputting' is outputting of results of the operation processes, the 'in-order outputting' being opposed to the 'out-of-order outputting'. For example, the 'in-order outputting' is outputting of results of the operation processes in the order of inputting of the operation instructions.

On the other hand, as described above, a simulator does not exist which can simulate a processor which executes the pipeline processing of the operation instructions, and performs the in-order execution and out-of-order outputting. However, when a processor model described by hardware description language (HDL) is used, because this processor model is a rigid circuit, precise simulation of the processor can be executed.

However, although a simulator in the related art can perform a simulation of an ordinary processor which performs the in-order execution and in-order outputting, the simulator in the related art cannot execute processing in which execution of a certain operation instruction finishes before (passes) previously started execution of another operation instruction due to a differing number of execution cycles between the certain operation instruction and the other operation instruction executed in parallel therewith, with regard to simulation of a processor which performs in-order execution and out-of-order outputting.

Further, in the case where a processor model described by hardware description language (HDL) is used, precise simulation of the processor can be performed because the processor model is a rigid circuit as mentioned above. However, the simulation speed is low and a significant time is required for debugging of the program.

Further, in the case where a processor model described by hardware description language (HDL) is used, execution of an operation instruction may pass previously started execution of another operation instruction due to the number of execution cycles of each operation instruction which is executed in parallel with execution of the other operation instructions. As a result, the order in which results of the operation processes are obtained is not necessarily equal to the order described in the program. Therefore, it is difficult to detect errors in the program unless a description for detecting errors is added.

SUMMARY OF THE INVENTION

An object of the present invention is to provide a simulator, in which execution of an operation instruction can pass previously started execution of another operation instruction due to in-order execution and out-of-order outputting, and a high-speed simulation and easy detection of errors in a program can be achieved as a result of detecting and indicating that execution of an operation instruction passes previously started execution of another operation instruction, a condition of waiting for enablement of an operation process occurring due to contention for a computing-unit resource, and an exceptional timing of outputting a result of an operation process occurring.

Another object of the present invention is to provide a simulation method using the above-described simulator.

A simulator, according to the present invention, can simulate a processor which performs pipeline processing of operation instructions, and performs operation processes in parallel, the number of the operation processes being larger than the number of the pipelines, wherein the simulator simulates a passing operation in which a result of an operation process obtained from execution of the operation instruction is output earlier than a result of another operation process obtained from previously started execution of another operation instruction, the passing operation occurring due to the number of execution cycles of each operation instruction which is executed in parallel with execution of other operation instructions.

The simulator according to the present invention can perform simulation of not only an ordinary processor which performs in-order execution and in-order outputting, but also a processor which performs in-order execution and out-of-order outputting, and can simulate the passing operation.

Further, because the simulator according to the present invention does not perform simulation using a rigid circuit (simulation model), it is possible to achieve high-speed simulation and high-speed program. debugging, in comparison to the case where simulation is executed by using a processor model described with the hardware description language (HDL).

The simulator may comprises passing-operation detecting means (corresponding to a passing-operation detecting portion 31 in an embodiment to be described later) for detecting occurrence of the passing operation.

In the simulator according to the present invention, similarly to the case where simulation is executed by using a processor model described with the hardware description language (HDL), the order in which results of the operation processes are obtained is not necessarily equal to the order described in the program due to occurrence of the passing operation. As a result of the passing-operation detecting means detecting occurrence of the passing operation, indication of the occurrence of the passing operation can be performed, and thereby, errors in the program can be easily detected.

The simulator may further comprises passing-operation searching means (corresponding to a passing-operation marking portion 36 in the embodiment to be described later) for previously searching for an operation instruction, execution of which may cause the passing operation, before execution of the simulation, wherein the passing-operation detecting means detects whether execution of the operation instruction, which has been found by the passing-operation searching means, actually passes previously started execution of another operation instruction.

Thus, the passing-operation detecting means detects whether execution of the operation instruction actually passes previously started execution of the operation instruction, only for the operation instructions which have been found by the passing-operation searching means. The passing-operation detecting means does not perform the detecting operation for the other operation instructions.

Accordingly, it is possible to achieve a high-speed simulation and high-efficiency program debugging.

The simulator may comprise waiting-condition detecting means (corresponding to a pipeline-stall detecting portion 32 in the embodiment to be described later) for detecting a condition of waiting for enablement of an operation process, which condition occurs due to contention for a computing-unit resource.

In the simulator according to the present invention, the order in which results of the operation processes are obtained is not necessarily equal to the order described in the program, due to occurrence of the passing operation. As a result of the waiting-condition detecting means detecting the condition of waiting for enablement of the operation process, which condition occurs due to the contention for the computing-unit resource, indication of the condition of waiting for enablement of the operation process can be performed, and thereby, errors in the program can be easily detected.

The simulator may further comprise resource-contention searching means (corresponding to a resource-contention marking portion 37 in the embodiment to be described later) for previously searching for the operation instructions, execution of which results in the contention for the computing-unit resource, before execution of the simulation, wherein the waiting-condition detecting means detects, whether the condition of waiting for enablement of the operation process occurs, as a result of determining whether contention occurs between the computing-unit resource which is used for execution of the operation instruction, which has been found by the resource-contention searching means, and the computing-unit resource which is used for previously started execution of another operation instruction.

Thus, the waiting-condition detecting means detects, whether the condition of waiting for enablement of the operation process occurs, as a result of determining whether contention occurs between the computing-unit resource which is used for execution of the operation instruction and the computing-unit resource which is used for execution of another operation instruction, execution of which is started previously, only for the operation instructions which have been found by the resource-contention searching means. The waiting-condition detecting means does not perform the waiting-condition detecting operation for the other operation instructions.

Accordingly, it is possible to achieve a high-speed simulation and high-efficiency program debugging.

The simulator may comprise:

passing-operation detecting means for detecting occurrence of the passing operation;

waiting-condition detecting means for detecting a condition of waiting for enablement of an operation process, which condition occurs due to contention for a computing-unit resource;

resource memorizing means (corresponding to a resource using table 34 in the embodiment to be described later) for memorizing the computing-unit resources used for respective execution cycles of the operation process for each operation instruction; and resource managing means (corresponding to a resource management table 35 in the embodiment to be described later) for managing which computing-unit resources are used for previously started execution of another operation instruction, wherein the passing-operation detecting means and the waiting-condition detecting means detect occurrence of the passing operation and occurrence of the condition of waiting for enablement of the operation process, respectively, based on information obtained from the resource memorizing means and information obtained from the resource managing means.

Thus, the resource memorizing means previously memorizes the computing-unit resources used for respective execution cycles of the operation process for each operation instruction. As a result, it is possible to achieve a high-speed simulation and high-efficiency program debugging.

The simulator may further comprise exceptional-outputting-timing detecting means (corresponding to an exceptional-outputting-timing detecting portion 33 in the embodiment to be described later) for detecting an exceptional outputting timing at which a result of the operation process is output, the exceptional outputting timing being different from a predetermined outputting timing.

In the simulator according to the present invention, the order in which results of the operation processes are obtained is not necessarily equal to the order described in the program, due to occurrence of the passing operation. As a result of the exceptional-outputting-timing detecting means detecting the exceptional outputting timing at which the result of the operation process is output, indication of the exceptional outputting timing can be performed, and thereby, errors in the program can be easily detected.

The simulator may further comprise exceptional-outputting-timing searching means for previously searching for the operation instruction, execution of which may result in outputting of the result of the operation process at the exceptional outputting timing, before execution of the simulation, wherein the exceptional-outputting-timing detecting means detects whether the timing of outputting of the result of the operation process for the operation instruction which have been found by the exceptional-outputting-timing searching means is actually the exceptional outputting timing.

Thus, the exceptional-outputting-timing detecting means detects whether the timing of outputting of the result of the operation process for the operation instruction is actually the exceptional outputting timing, only for the operation instruction which has been found by the exceptional-outputting-timing searching means. The exceptional-outputting-timing detecting means does not perform the exceptional-outputting-timing detecting operation for the other operation instructions.

Accordingly, it is possible to achieve a high-speed simulation and high-efficiency program debugging.

In a simulation method, according to the present invention, a processor is simulated which performs pipeline processing of operation instructions, starts operation processes in an order in which the operation instructions are input, executes the operation processes in parallel with execution of other operation instructions, and outputs results of the operation processes in an order in which the operation processes are finished, wherein the method comprises the step of a) detecting a passing operation in which a result of an operation process obtained from execution of an operation instruction is output earlier than a result of another operation process obtained from previously started execution of another operation instruction (corresponding to steps S1 through S10 in the embodiment to be described later).

In the simulation method according to the present invention, the order in which results of the operation processes are obtained is not necessarily equal to the order described in the program due to occurrence of the passing operation which occurs due to a difference in the number of execution cycles of each operation instruction which is executed in parallel with execution of other operation instructions. However, in the above-described method, the passing operation can be detected in the passing-operation detecting step a) and the passing operation can be indicated. As a result, detecting of errors in the program can be easily performed.

The simulation method may further comprise the step of b) previously searching for an operation instruction, execution of which may cause the passing operation (corresponding to steps S11 through S17 in the embodiment to be described later), before execution of the simulation, wherein the step a) detects whether execution of the operation instructions, which have been found by the step b), actually passes previously started execution of another operation instruction.

Thus, in the passing-operation detecting step a), it is detected whether execution of the operation instruction actually passes previously started execution of the other operation instruction, only for the operation instruction which has been found in the operation-instruction searching step b). In the passing-operation detecting step a), the detecting operation is not performed for other operation instructions.

The simulation method may further comprises the step of b) detecting a condition of waiting for enablement of an operation process, which condition occurs due to contention for a computing-unit resource (corresponding to steps S21 through S32 in the embodiment described later).

In this simulation method, the order in which results of the operation processes are obtained is not necessarily equal to the order described in the program due to occurrence of the passing operation which occurs due to the number of execution cycles of each operation instruction which is executed in parallel with execution of other operation instructions. However, in the simulation method, the condition of waiting for enablement of the operation process can be detected in the waiting-condition detecting step b) and the condition of waiting can be indicated, which condition occurs due to contention for a computing-unit resource. Therefore, detecting of errors in the program can be easily performed.

The simulation method may further comprise the step of c) previously searching for operation instructions, execution of which may result in contention for the computing-unit resource, before execution of the simulation (corresponding to the steps S21 through S32 in the embodiment to be described later), wherein the step b) detects, whether the condition of waiting for enablement of the operation process occurs, as a result of determining whether contention occurs between the computing-unit resource which is used for execution of the operation instruction, which has been found by the step c), and the computing-unit resource which is used for previously started execution of the operation instruction.

Thus, in the waiting-condition detecting step b), it is detected whether the condition of waiting for enablement of the operation process occurs, as a result of determining whether contention occurs between the computing-unit resource which is used for execution of the operation instruction and the computing-unit resource which is used for execution of the operation instruction, execution of which is started previously, only for the operation instruction which has been found by the resource-contention searching step c). In the waiting-condition detecting step b), the waiting-condition detecting operation is not performed for other operation instructions.

Accordingly, it is possible to achieve a high-speed simulation and high-efficiency program debugging.

In the simulation method, in the passing-operation detecting step a) and the waiting-condition detecting step b), based on information obtained from resource memorizing means for memorizing the computing-unit resources used for respective execution cycles of the operation process for each operation instruction, and information obtained from resource managing means for managing as to which computing-unit resources are used for previously started execution of the operation instructions, occurrence of the passing operation and occurrence of the condition of waiting for enablement of the operation process are detected (corresponding to the steps S1 through S10, S21 through S32 in the embodiment to be described later), respectively.

Thus, the resource memorizing means previously memorizes the computing-unit resources used for respective execution cycles of the operation process for each operation instruction. As a result, it is possible to achieve a high-speed simulation and high-efficiency program debugging.

The simulation method may further comprise the step of b) detecting an exceptional outputting timing at which a result of the operation process is output (corresponding to steps S41 through S45 in the embodiment to be described later), the exceptional outputting timing being different from a predetermined outputting timing.

In the simulation method according to the present invention, the order in which results of the operation processes are obtained is not necessarily equal to the order described in the program, due to occurrence of the passing operation which occurs due to a difference in the number of execution cycles of each operation instruction which is executed in parallel with execution of other operation instructions. However, in the above-described method, the exceptional outputting timing can be detected in the exceptional-outputting-timing detecting step b) and the exceptional-outputting-timing can be indicated. As a result, detecting of errors in the program can be easily performed.

The simulation method may further comprise the step of c) previously searching for the operation instruction, execution of which may result in outputting of the result of the operation process at the exceptional outputting timing (corresponding to steps S41 through S45 in the embodiment described later), before execution of the simulation, wherein the step b) detects whether the timing of outputting of the result of the operation process for the operation instruction which-has been found by the step c) is actually the exceptional outputting timing.

Thus, in the exceptional-outputting-timing detecting step b), it is detected whether the timing of outputting of the result of the operation process for the operation instruction is actually the exceptional outputting timing, only for the operation instructions which have been found in the exceptional-outputting-timing searching step c). In the exceptional-outputting-timing. detecting step b), the exceptional-outputting-timing detecting operation is not performed for other operation instructions.

Accordingly, it is possible to achieve a high-speed simulation and high-efficiency program debugging.

A computer readable recording medium, according to the present invention, stores a program for causing a computer to perform simulation of a processor which performs pipeline processing of operation instructions, the program causing the computer to simulate a passing operation in which a result of the operation process obtained from execution of an operation instruction is output earlier than a result of another operation process obtained from previously started execution of another operation instruction, the passing operation occurring due to the number of execution cycles of each operation instruction which is executed in parallel with execution of other operation instructions.

The program may cause the computer to execute the steps of:

a) detecting occurrence of the passing operation (corresponding to the steps S1 through S10 in the embodiment described later);

b) previously searching for an operation instruction, execution of which may cause the passing operation, before execution of the simulation (corresponding to the steps S11 through S17);

c) detecting a condition of waiting for enablement of an operation process (corresponding to the steps S21 through S32 in the embodiment to be described later), which condition occurs due to contention for a computing-unit resource:

d) previously searching for an operation instruction, execution of which may result in the contention for the computing-unit resource, before execution of the simulation (corresponding to the steps S21 through S32 in the embodiment to be described later);

e) detecting an exceptional outputting timing at which a result of the operation process is output (corresponding to the steps S41 through S45 in the embodiment to be described later), the exceptional outputting timing being different from a predetermined outputting timing; and f) previously searching for an operation instruction, execution of which may result in outputting of the result of the operation process at the exceptional outputting timing, before execution of the simulation (corresponding to the steps S41 through S45 in the embodiment to be described later).

In the simulation performed by the computer in accordance with the program, simulation of not only an ordinary processor which performs in-order execution and in-order outputting, but also a processor which performs in-order execution and out-of-order outputting can be performed, and the passing operation can be simulated.

Further, in the simulation performed by the computer in accordance with the program, because a simulation is not performed using a rigid circuit (processor model), it is possible to achieve a high-speed simulation and high-speed program debugging, in comparison to the case where simulation is executed by using the processor model described with the hardware description language (HDL).

Other objects and further features of the present invention will become more apparent from the following detailed descriptions when read in conjunction with the accompanying drawings.

BRIEF DESCRIPTIONS OF THE DRAWINGS

FIG. 8 shows a resource using table for respective operation instructions;

FIG. 9 shows a resource management table;

DESCRIPTION OF PREFERRED EMBODIMENT

An embodiment of a simulator according to the present invention which can perform a simulation of a processor which performs in-order execution and out-of-order outputting, and a simulation method according to the present invention for the processor, using the above-mentioned simulator, will now be described with reference to figures.

Figure 2:
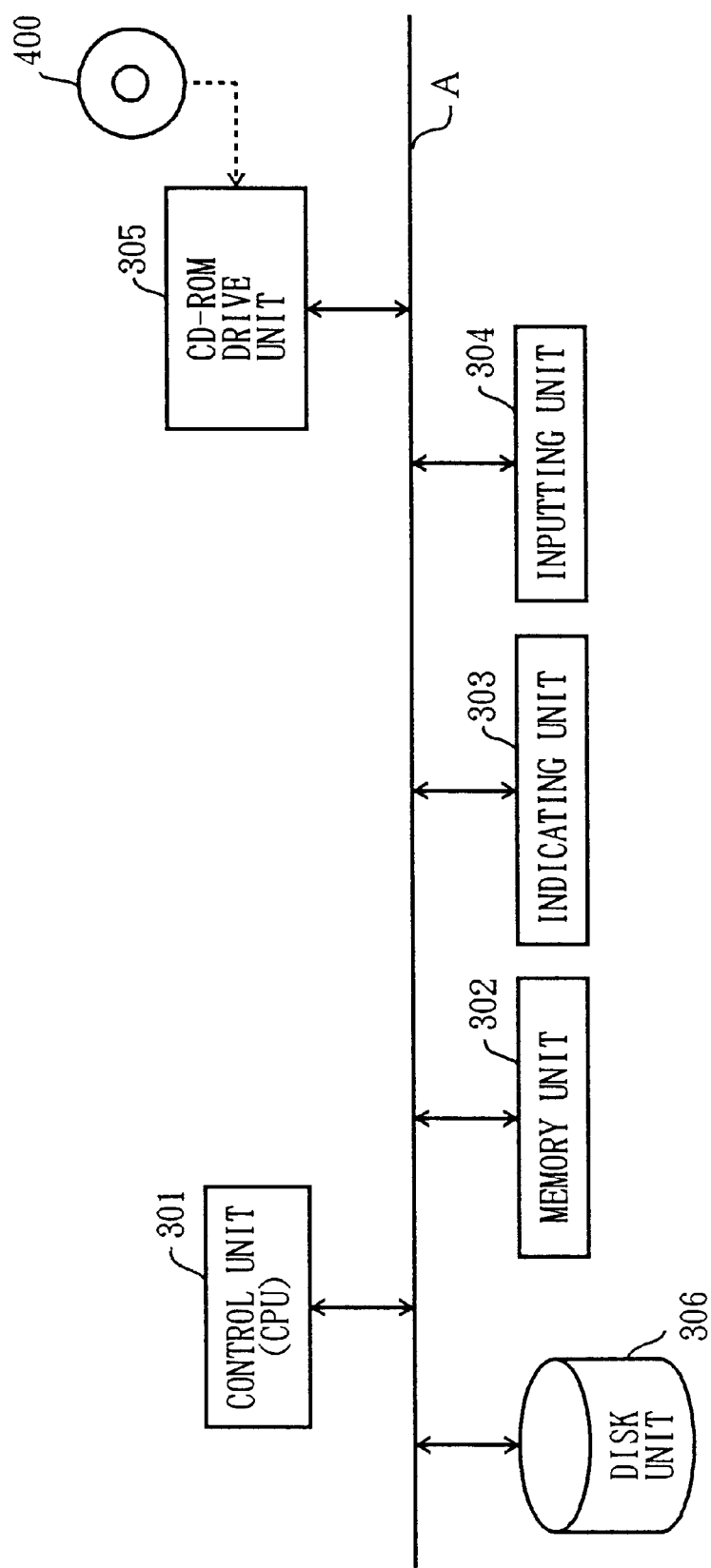
FIG. 2 shows an arrangement of a simulator.

FIG. 2 shows an arrangement of a simulator according to the present invention.

A simulator according to the present invention can be realized by a general-purpose computer. For example, as shown in FIG. 2, a simulator according to the present invention includes a control unit 301 including a CPU, a memory unit 302, a indicating unit 303, an inputting unit 304, a CD-ROM drive unit 305 and a disk unit 306. These units are interconnected via a system bus A.

In the simulator according to the present invention, the control unit 301, for example, executes a program including steps of performing operation processes in parallel in an order in which operation instructions are input (in-order execution), and outputting the results of the operation processes in an order in which the operation processes are finished (out-of-order outputting). Further, according to the program, execution of a certain operation instruction may pass previously started execution of another operation instruction due to a difference in a number of execution cycles of each operation instruction which is executed in parallel with execution of other operation instructions.

The memory unit 302 includes memories such as a RAM, a ROM and so forth, and stores programs to be executed by the control unit 301 and data which is obtained during data processing.

The indicating unit 303 includes a CRT, LCD (Liquid Crystal Display) or the like, and indicates various pictures.

The inputting unit 304 includes a keyboard, a mouse and so forth.

The program is stored in a CD-ROM 400. The program includes steps of performing the operation processes in parallel in an order in which operation instructions are input (in-order execution), and outputting the results of the operation processes in order in which the operation processes are finished (out-of-order outputting). Further, according to the program, execution of an operation instruction passes previously started execution of another operation instruction, due to a difference in a number of execution cycles of each operation instruction which is executed in parallel with execution of other operation instructions.

The program is read out from the CD-ROM 400 set in the CD-ROM drive unit 305 and is installed in the disk unit 306. Then, when the simulator (computer) is started up, the program read out from the disk unit 306 is stored in the memory unit 302. In this condition, the control unit (CPU) 301 executes the above-mentioned program.

A recording medium for providing the above-mentioned program is not limited to the CD-ROM 400, but another recording medium, such as a magnetic disk such as a floppy disk, a magneto-optical disk, a magnetic tape, or the like, can be used depending on the simulator (computer).

Figure 1:
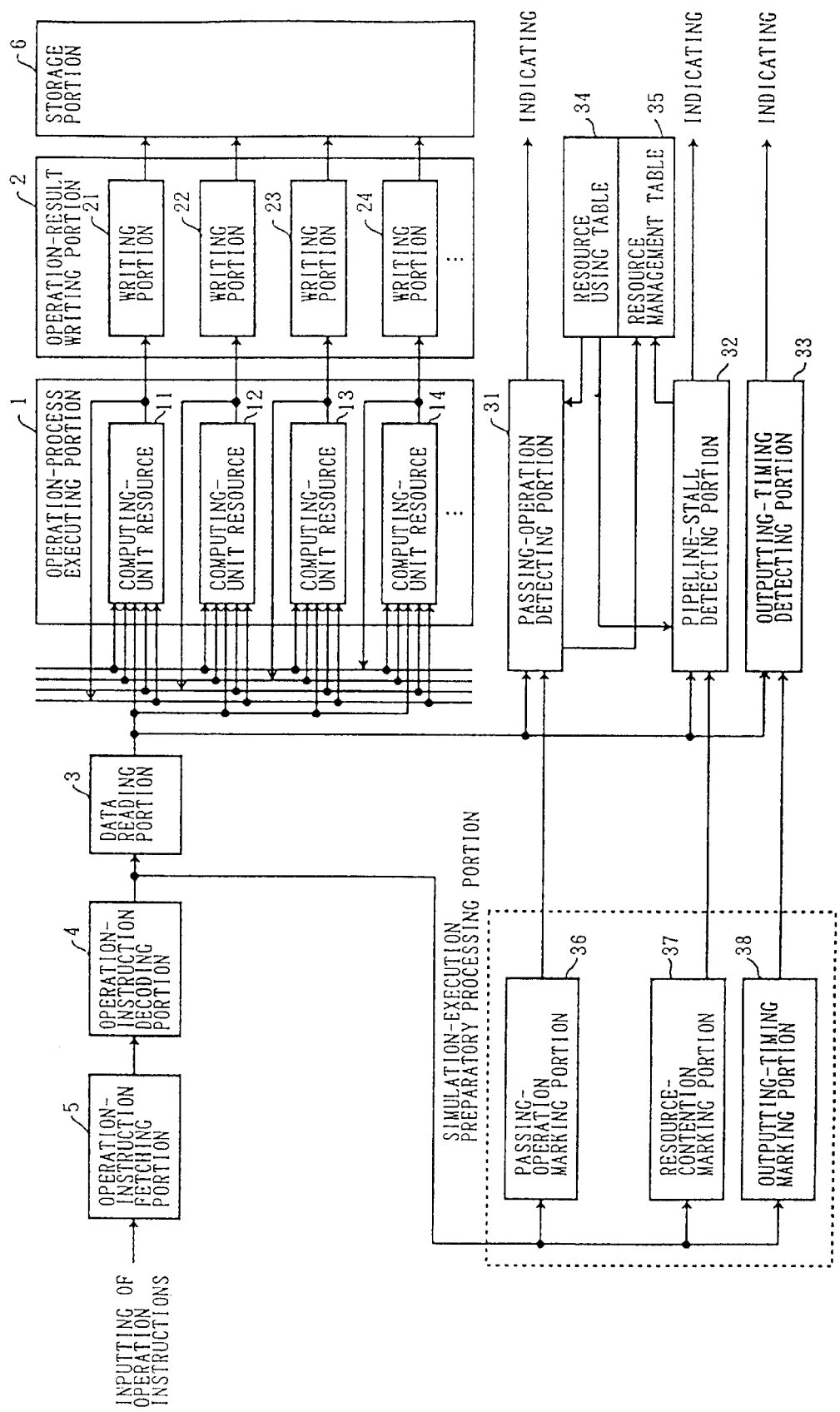
FIG. 1 shows an operation principle of the present invention.

FIG. 1 shows an operation principle of the simulator according to the present invention which executes the above-mentioned program.

In FIG. 1, the simulator according to the present invention includes an operation-instruction fetching portion 5, an operation-instruction decoding portion 4, a data reading portion 3, an operation-process executing portion 1 and an operation-result writing portion 2. In this simulator, a plurality of computing-unit resources is included in a single pipeline. Thereby, the operation processing can be executed in a minimum number of cycles. In other words, in the simulator according to the present invention, when simulation of the processor which performs the in-order execution and out-of-order outputting is executed, it is possible that execution of a certain operation instruction passes previously started execution of another operation instruction due to a difference in a number of execution cycles of each operation instruction executed in parallel with execution of other operation instructions.

The operation-instruction fetching portion 5 has a function of fetching microcode as the operation instructions.

The operation-instruction decoding portion 4 has a function of decoding the microcode fetched by the operation-instruction fetching portion 5.

The data reading portion 3 has a function of reading necessary data from a storage portion 6 based on the operation instructions decoded by the operation-instruction decoding portion 4.

The operation-process executing portion 1, which forms the pipeline, includes a plurality of computing-unit resources 11, 12, 13 and 14 which can perform operations, for example, addition, subtraction, multiplication, division, sum-of-products operations, and so forth, and can be connected with each other arbitrarily. The operation-process executing portion 1 has a function of executing predetermined operation processes using data read by the data reading portion 3, which data is necessary for the operation processes, in accordance with operation instructions decoded by the operation-instruction decoding portion 4. The operation-process executing portion 1 executes the operation processes efficiently as a result of arbitrary changing an order in which the respective computing-unit resources are to be used and the number of the computing-unit resources to be used.

The operation-result writing portion 2 has a multi-port arrangement, thereby results of the operation processes of the computing-unit resources 11, 12, 13 and 14 are written in the storage portion 6 individually, and includes writing portions 21, 22, 23 and 24 corresponding to the computing-unit resources 11, 12, 13 and 14, respectively. The operation-result writing portion 2 uses in-order execution and out-of-order outputting so that contention of writing of operation results by the respective computing-unit resources 11, 12, 13 and 14 can be avoided.

The simulator according to the present invention shown in FIG. 1 further includes an passing-operation detecting portion 31, a pipeline-stall detecting portion 32, an exceptional-outputting-timing detecting portion 33, a passing-operation marking portion 36, a resource-contention marking portion 37 and an exceptional-outputting-timing marking portion 38. By the respective portions, an operation of passing of execution of an operation instruction, a condition of waiting for enablement of an operation process due to contention for a computing-unit resource (hereinafter, referred to as 'pipeline stall'), and an exceptional timing of outputting the result of the operation process are detected. Thereby, easy detection of errors in the program can be achieved.

The passing-operation detecting portion 31 has a function of detecting whether execution of an operation instruction passes previously started execution of another operation instruction, based on the operation instructions decoded by the operation-instruction decoding portion 4, a resource using table 34 and a resource management table 35, and a function of indicating and informing of occurrence of passing operations. The resource using table 34 stores, for the respective execution cycles, the computing-unit resources used for executing the operation instructions. The resource management table 35 is used for managing a condition as to how the computing-unit resources, used for executing the operation instruction, execution of which is currently started and for executing the operation instruction, execution of which was previously started, are used.

The passing-operation marking portion 36 has a function of previously marking the operation instructions, by execution of which a passing operation may occur, before the operation instruction is executed, that is, immediately after the operation instruction is decoded by the operation-instruction decoding portion 4.

The pipeline-stall detecting portion 32 has a function of detecting whether a pipeline stall of an operation instruction occurs due to contention between the computing-unit resource which is used for executing the latest operation instruction decoded by the operation-instruction decoding portion 4 and the computing-unit resource which is used for executing the preceding operation instruction, and a function of indicating and informing of occurrence of the pipeline stall.

The resource-contention marking portion 37 has a function of previously marking the operation instruction, by execution of which contention for the computing-unit resource may occur, before the operation instruction is executed, that is, immediately after the operation instruction is decoded by the operation-instruction decoding portion 4.

The exceptional-outputting-timing detecting portion 33 has functions of detecting whether a timing of outputting of a result of an operation process for an operation instruction provided from the data reading portion 3 is actually an exceptional outputting timing, and of indicating and informing of occurrence of exceptional outputting timing.

The exceptional-outputting-timing marking portion 38 has a function of previously marking the operation instruction, by execution of which exceptional outputting timing may occur, before the operation instruction is executed, that is, immediately after the operation instruction is decoded by the operation-instruction decoding portion 4.

In the simulator according to the present invention, because execution of a certain operation instruction passes previously started execution of another operation instruction due to a difference in the number of execution cycles of each operation instruction executed in parallel with execution of the other operation instructions, the order in which the results of operation processes are obtained is not equal to the order described in the program. However, in the simulator according to the present invention, it is possible to detect and indicate a passing operation, occurrence of the pipeline stall of the operation process due to contention for the computing-unit resource, and occurrence of exceptional outputting timing of the result of the operation process, through the passing-operation detecting portion 31, pipeline-stall detecting portion 32 and exceptional-outputting-timing detecting portion 33. As a result, detection of errors in the program can be easily performed.

Thus, when a simulation is performed by using the simulator according to the present invention having the arrangement shown in FIG. 1, simulation of the processor which performs in-order execution and in-order outputting can be executed as in the past, and also, simulation of the processor which performs in-order execution and out-of-order outputting can be executed.

Further, in the simulator according to the present invention, because a simulation is not performed by using a rigid circuit (processor mode), a high-speed simulation can be achieved and high-efficiency debugging of the program can be achieved, in comparison to the case where a simulation is performed by using the processor model described with the hardware description language (HDL).

Figure 7:
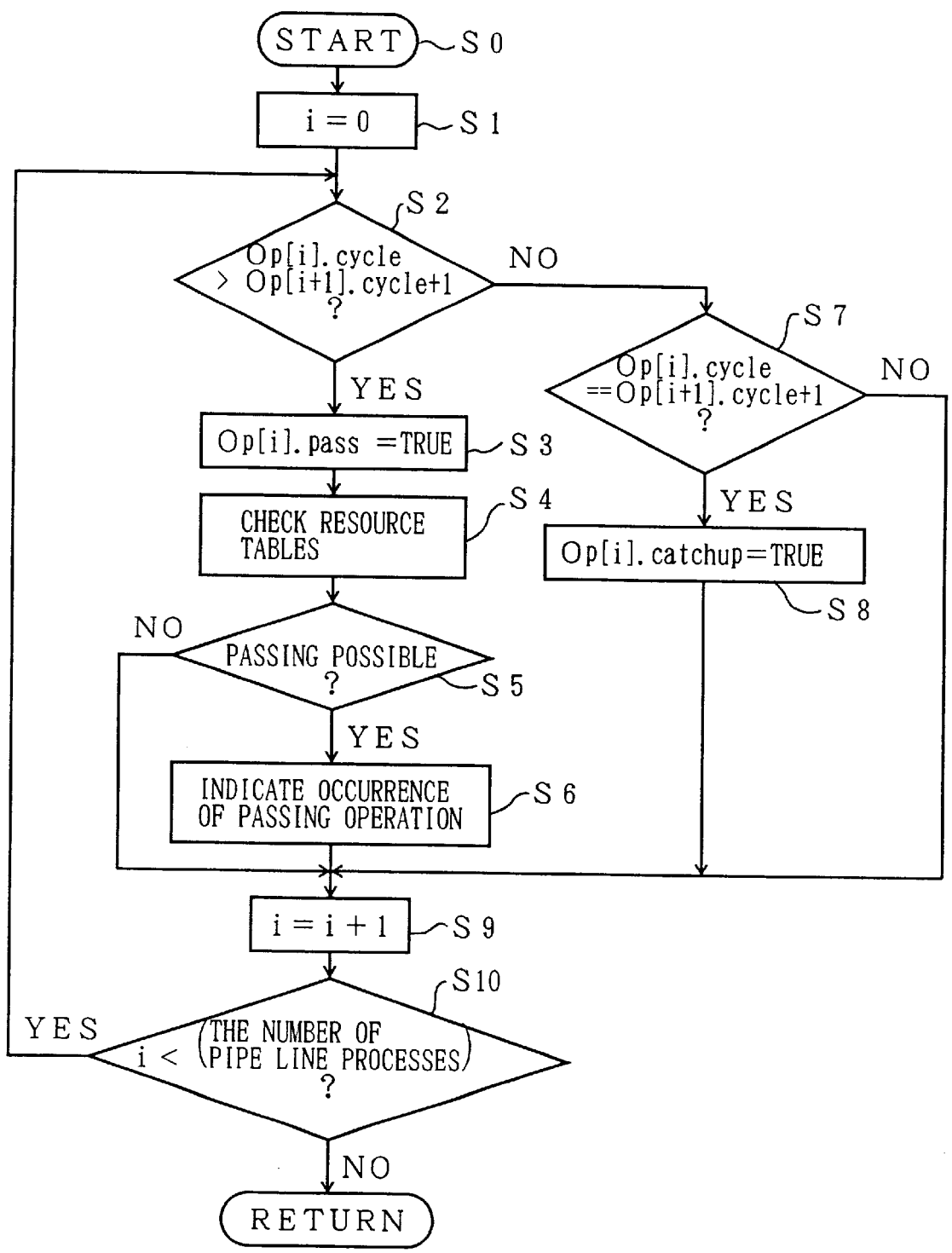
FIG. 7 shows a flowchart of operations for detecting occurrence of the passing operation.

FIG. 7 shows a flowchart of operations for detecting a passing operation in a case where simulation of the processor which performs the in-order execution and out-of-order outputting is performed by using the simulator shown in FIG. 1.

Figure 3:
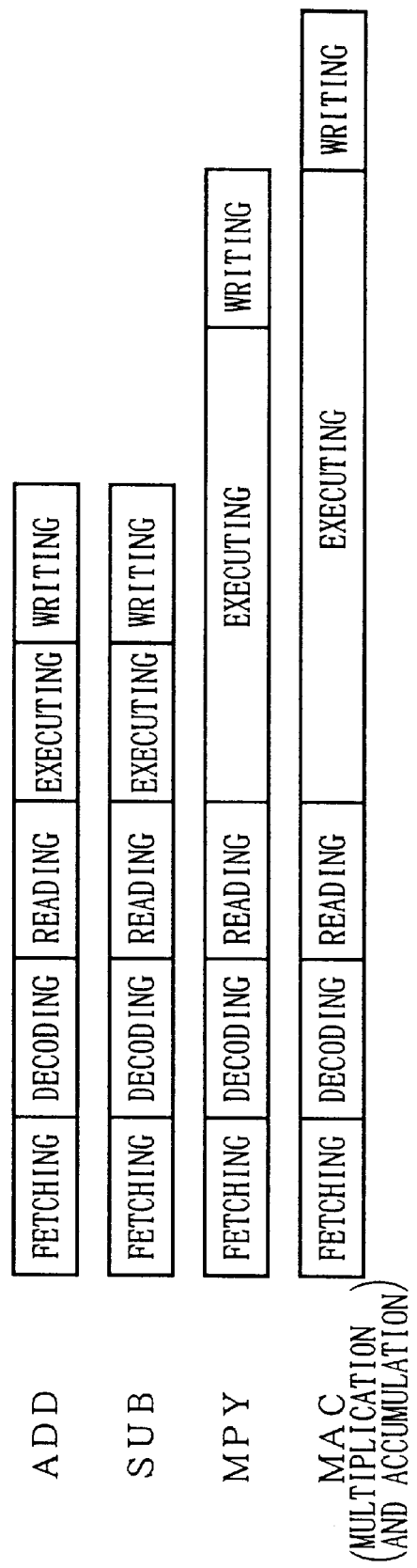
FIG. 3 shows examples of operation instructions, the number of execution cycles thereof being different from each other.

Operation instructions may comprise ADD (addition) instructions, SUB (subtraction) instructions, MPY (multiplication) instructions, MAC (multiplication and accumulation) instructions, or the like. The number of execution cycles may vary depending on the operation instructions, as shown in FIG. 3.

Figure 4:
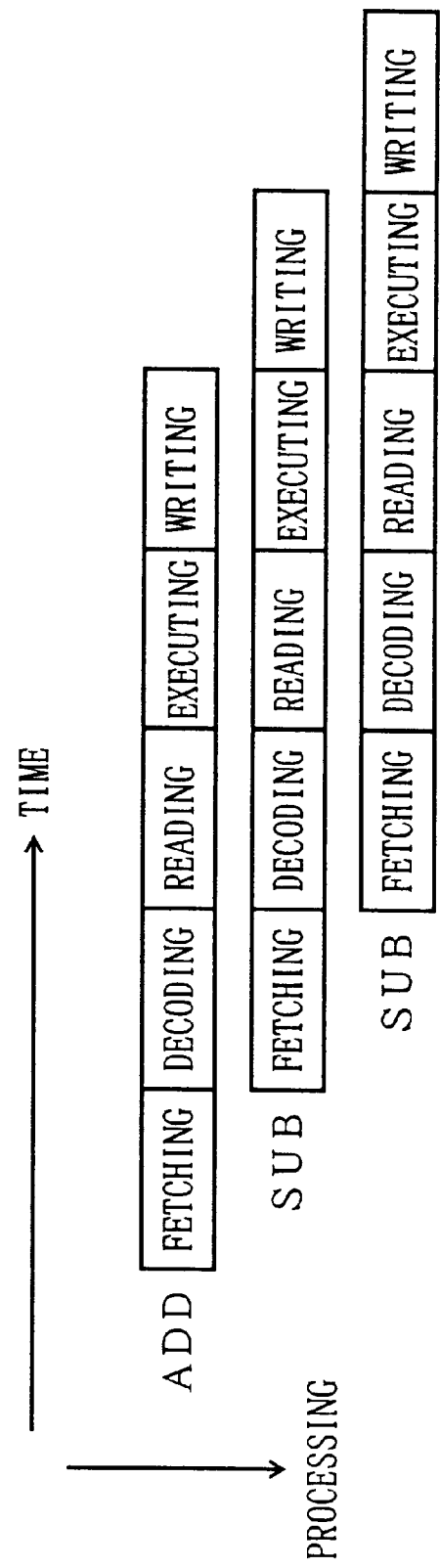
FIG. 4 shows an example of execution of pipeline processing.

In a case where the number of execution cycles of all the operation instructions is the same, and a simulation is performed by using the simulator shown in FIG. 1, the simulator performs, for example, as shown in FIG. 4, fetching, decoding, reading, executing the operations and writing, in the stated order, in the order in which the operation instructions are input (ADD instruction →SUB instruction →SUB instruction) in the pipeline processing.

Figure 5:
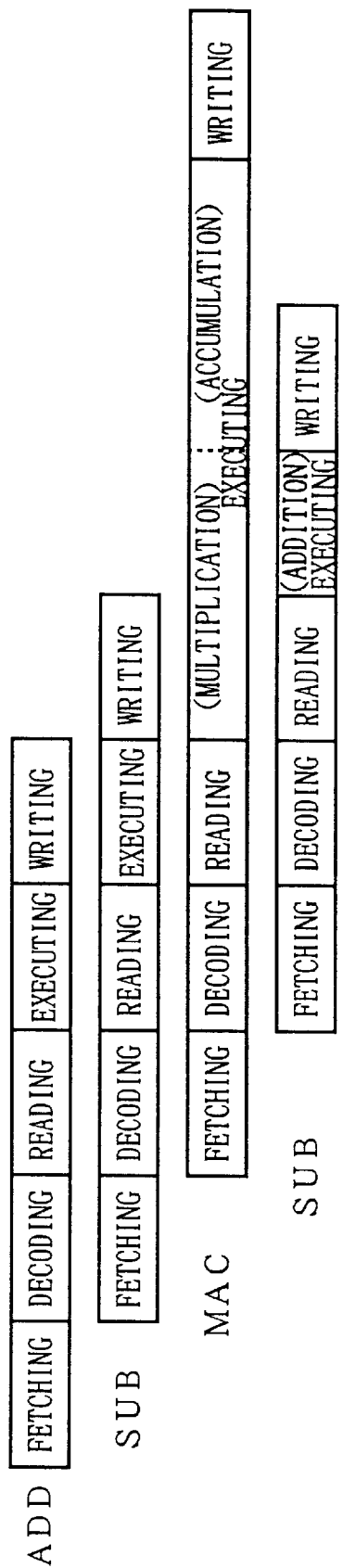
FIG. 5 shows a passing operation in which a result of an operation process obtained from execution of an operation instruction is output earlier than a result of another operation process obtained from previously started execution of another operation instruction.
Figure 6:
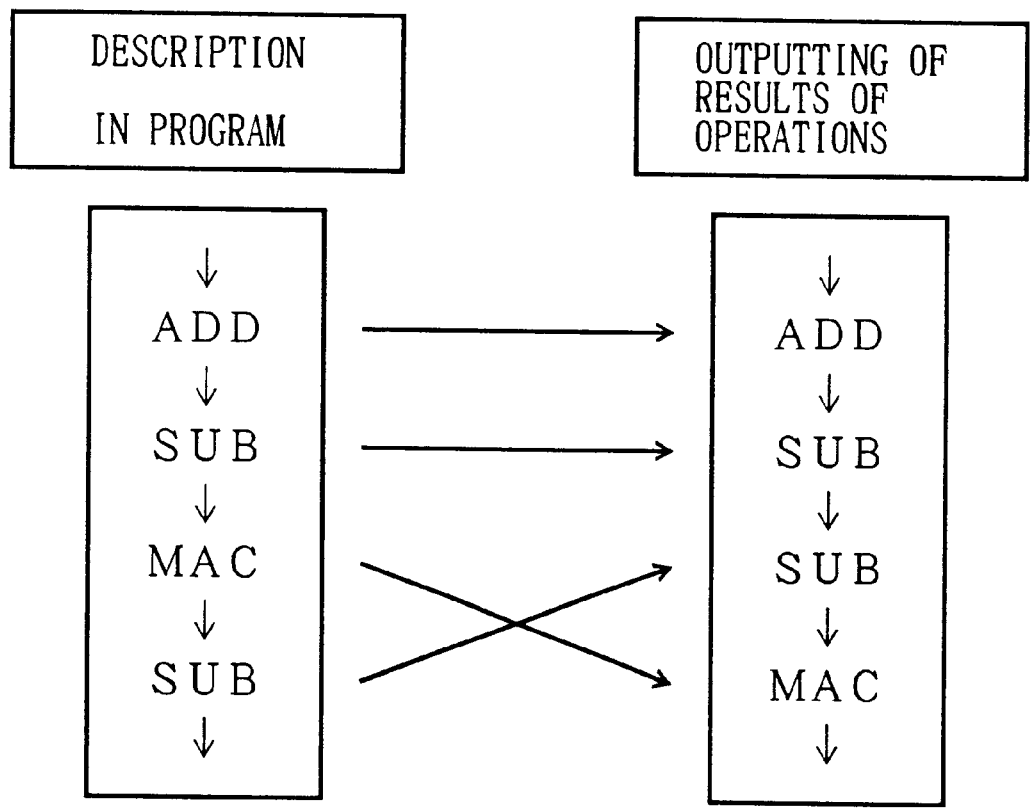
FIG. 6 shows a difference between an order, described in a program, in which order operation instructions are executed, and an order in which results of respective operation processes are output.

However, in a case where the number of execution cycles of the operation instructions varies, a passing operation may occur, as shown in FIG. 5. In the figure, the execution of the fourth subtraction (SUB). instruction passes the previously started execution of sum-of-products (MAC) instruction. As a result, as shown in FIG. 6, the order in which the results of the operation processes are obtained is not equal to the order described in the program (in-order execution and out-of-order outputting). Thereby, it is difficult to detect errors in the program.

Therefore, in the simulator according to the present invention, in order to enable easy detection of errors in the program, as shown in FIG. 7, occurrence of a passing operation is detected and indicated.

When microcode (operation instructions) is input to the simulator shown in FIG. 1, this microcode is fetched by the operation-instruction fetching portion 5, decoded by the operation-instruction decoding portion 4, and thus is recognized as the operation instructions.

The data reading portion 3 reads out information (such as input data and so forth), necessary for executing the operation instructions decoded by the operation-instruction decoding portion 4, from the storage portion 6, and, then, the operation-process executing portion 1 executes the operation instructions.

At the same time, in order to enable easy detection of errors in the program, the passing operation detecting portion 31 starts operations for detecting and indicating a passing operation (in a step S0).

The passing-operation detecting portion 31 sets '0' in a variable 'i' (in a step S1) and thus performs initial setting. Then, the passing-operation detecting portion 31 determines whether or not the following inequality holds (in a step S2):

$$Op[i].\ cycle > Op[i+1].\ cycle + 1$$

In the above inequality, each of 'Op[i]' and 'Op[i+1]' represents an instruction such as addition, subtraction, multiplication, division or the like. 'Op[i+1]' represent the latest operation instruction, while 'Op[i]' represents the immediately preceding operation instruction. Further, each of 'Op[i]. cycle' and 'Op[i+1]. cycle' represents the number of execution cycles of a respective one of 'Op[i]' and 'Op[i+1], that is, the number of cycles from fetching of the operation instruction through writing the result of the operation process for the operation instruction.

Accordingly, determination as to whether or not the following inequality holds $$Op[i].\ cycle > Op[i+1].\ cycle + 1$$

means determination as to whether or not there is a possibility that execution of the latest operation instruction 'Op[i+1]' passes execution of the immediately preceding operation instruction 'Op[i]' and thus finishes the execution cycles first.

For example, when it is determined that there is a possibility that execution of the operation instruction 'Op[i+1]' passes execution of the operation instruction 'Op[i] (YES in the step S2), the passing-operation detecting portion 31 sets '1' in a flag 'Op[i]. pass' which represents passing of the operation instruction (in a step S3). In 'Op[i]. pass', '0' was set as an initial value.

Then, the passing-operation detecting portion 31 reads out, from the resource using table 34 shown in FIG. 8, the computing-unit resource to be used for each execution cycle of the operation instruction 'Op[i+1]' (in a step S4). Then, the passing-operation detecting portion 31 determines whether or not it is possible to use the thus-read-out computing-unit resource(s), that is, whether or not the computing-unit resources) is (are) used for executing the immediately preceding operation instruction 'Op[i]', using the resource management table 35 shown in FIG. 9. Thus, the passing-operation detecting portion 31 determines whether or not execution of the operation instruction 'Op[i+1]' can actually pass execution of the immediately preceding operation instruction 'Op[i]' (in a step S5).

Then, when determining that the necessary computing-unit resource(s) is (are) not used for executing the immediately preceding operation instruction 'Op[i]' and thus the resource(s) can be used for executing the operation instruction 'Op[i+1]', the passing-operation detecting portion 31 determines that execution of the operation instruction 'Op[i+1]' can actually pass execution of the immediately preceding operation instruction 'Op[i]' (YES of the step S5). Then, the passing-operation detecting portion 31 causes occurrence of a passing operation to be indicated on the simulator (in a step S6), and adds '1' to the variable 'i' (in a step S9).

When determining that the necessary computing-unit resource(s) is (are) used for executing the immediately preceding operation instruction 'Op[i]' and thus the resources) cannot be used for executing the operation instruction 'Op[i+1]', the passing-operation detecting portion 31 determines that execution of the operation instruction 'Op[i+1]' cannot actually pass execution of the immediately preceding operation instruction 'Op[i]' (NO of the step S5). Then, the passing-operation detecting portion 31 adds '1' to the variable 'i' (in the step S9). At this time, for the operation instruction 'Op[i+1]', a condition of waiting occurs and remains until the necessary computing-unit resource(s) is (are) not in use for executing the other instruction.

When it is determined that the inequality

Op[i]. cycle>Op[i+1]. cycle+1 does not hold, that is, there is no possibility that execution of the operation instruction 'Op[i+1]' passes execution of the operation instruction 'Op[i]' (NO in the step S2), the passing-operation detecting portion 31 determines whether or not the following equation holds (in a step S7)

Op[i]. cycle==Op[i+1]. cycle+1

Determination as to whether or not the equation

Op[i]. cycle==Op[i+1]. cycle+1 holds means determination as to whether or not there is a possibility that execution of the latest operation instruction 'Op[i+1]' catches up with execution of the immediately preceding operation instruction 'Op[i]' and thus the execution cycles of the operation instruction 'Op[i+1]' finish at the same time as the preceding operation instruction 'Op[i]'.

For example, when it is determined in the step S7 that there is a possibility that execution of the latest operation instruction 'Op[i+1]' catches up with execution of the immediately preceding operation instruction 'Op[i]' (YES in the step S7), the passing-operation detecting portion 31 sets '1' in a flag 'Op[i]. catchup' which represents catching up of execution of the operation instruction (in a step S8), and, then, adds '1' to the variable 'i' (in the step S9). '0' was set in the 'Op[i]. catchup' as an initial value.

When neither execution of the operation instruction Op[i+1] passes execution of the operation instruction Op[i] nor execution of the operation instruction Op[i+1] catches up with execution of the operation instruction Op[i] (NO in the step S2, and NO in the step S7), the passing-operation detecting portion 31 adds '1' to the variable 'i' (in the step S9).

When the variable 'i' is updated in the step S9, the passing-operation detecting portion 31 determines whether or not the variable 'i' is smaller than the number of the pipeline processes in a step S10.

When it is determined that the variable 'i' is smaller than the number of pipeline processes (YES in the step S10), the passing-operation detecting portion 31 performs the operations from the step S2 through the step S10 for the subsequent operation instruction. The above-mentioned operations are repeated until all the pipeline processes are finished (NO of the step S10).

When a simulation is performed in the above-described method, because the simulator according to the present invention can inform of occurrence of passing of the operation instruction, a programmer who uses the simulator can easily determine whether the simulator intentionally uses passing of the operation. instruction so as to improve the processing speed or passing of the operation instruction occurs accidentally. Thereby, detection of errors in the program can be easily performed.

However, although passing of the operation instruction, which cannot be detected in a simulation in the related art, can be detected in the simulation shown in FIG. 7, because it is determined for all the operation instructions (pipeline processes) whether or not passing of the operation instructions occurs, degradation of the simulation efficiency (processing speed) cannot be avoided.

In order to improve the simulation speed, in the simulator shown in FIG. 1, it is possible to select one of the method of simulation of the processor shown in FIG. 7 and another method of simulation of the processor.

The other method of simulation of the processor is a method in which, before execution of the simulation shown in FIG. 7, the passing-operation marking portion 36, which previously marks the operation instruction, execution of which may pass previously started execution of the other operation instruction, is used, and the passing-operation detecting portion 31 detects whether execution of the thus-marked operation instruction actually passes the previously started execution of the other operation instruction.

Figure 10:
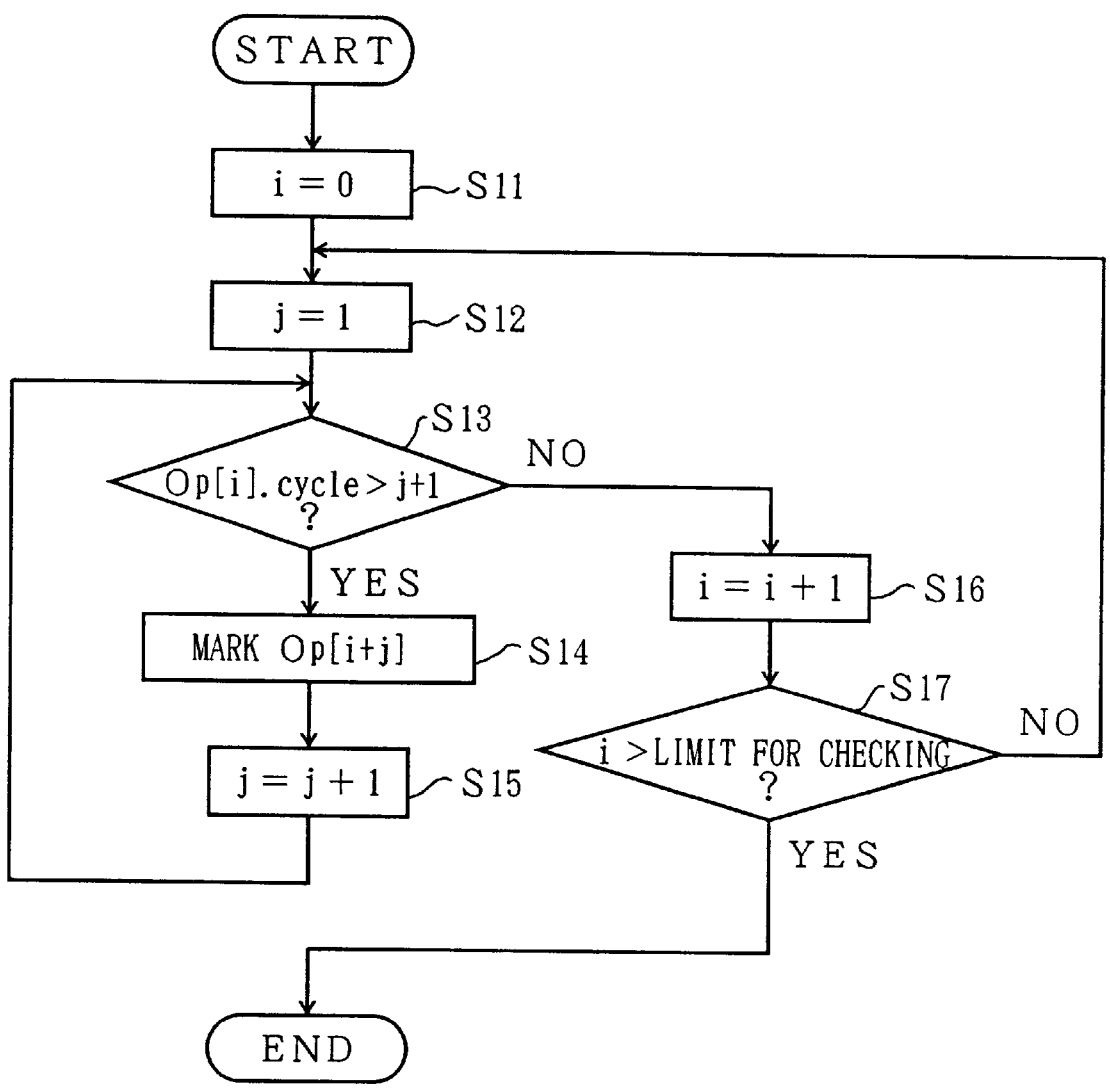
FIG. 10 shows a flowchart of operations for marking an operation instruction, execution of which may pass previously started execution of another operation instruction.

FIG. 10 shows a flowchart of marking of the operation instruction, execution of which may pass previously started execution of the other operation instruction, by the passing-operation marking portion 36. The operations shown in FIG. 10 are preparatory processing for the actual simulation operations.

Passing of execution of the operation instructions in the pipeline processes occurs when the operation instruction requiring few execution cycles is executed after execution of the operation instruction requiring many execution cycles. That is, for example, as shown in FIG. 5, execution of the MAC operation (third operation process) is passed by execution of the SUB operation (fourth operation process).

Specifically, passing of execution of the operation instruction occurs, for example, when, the instruction including one cycle of operation process (for example, simple subtraction) is executed after the operation instruction including at least three cycles of operation process (for example, first multiplication, second multiplication and addition, in the single sum-of-products instruction) is executed.

The above-mentioned condition is used as a condition for marking, and the passing-operation marking portion 36 performs the marking of the operation instruction, execution of which may pass previously started execution of the other operation instruction. The operations of the marking will now be described with reference to FIG. 10.

The passing-operation marking portion 36 sets '0' in a variable 'i' (in a step S11), and sets '1' in a variable 'j' (in a step S12). Then, the passing-operation marking portion 36 determines whether or not the following inequality holds (in a step S13):

$$Op[i].\ cycle > j+1$$

That is, it is determined whether or not at least three cycles are required for the operation process of the instruction 'Op[0]'.

For example, when $$Op[0].\ cycle = 4,$$

the following inequality holds (YES in the step S13)

$$Op[i].\ cycle > j+1$$

Then, it can be determined that there is a possibility that execution of the subsequent instruction 'Op[1]' passes execution of the instruction 'Op[0]', and the passing-operation marking portion 36 marks the instruction 'Op[i+j]', that is, 'Op[1]' (in a step S14).

Further, the passing-operation marking portion 36 sets 'j+1', that is, '2', in the variable 'j' (in a step S15), and determines again whether the following inequality holds (in the step S13):

$$Op[i].\ cycle > j+1$$

The following inequality holds (YES in the step S13):

$$Op[0].\ cycle > 2+1$$

Then, it can be determined that there is a possibility that execution of the further subsequent instruction 'Op[2]' passes execution of the instruction 'Op[0]', and the passing-operation marking portion 36 marks the instruction 'Op[i+j]', that is, 'Op[3]' (in a step S14).

Further, the passing-operation marking portion 36 sets 'j+1', that is, '3', in the variable 'j' (in a step S15), and determines again whether the following inequality holds (in the step S13):

$$Op[i].\ cycle > j+1$$

The following inequality does not hold (NO in the step S13):

$$Op[0].\ cycle > 3+1$$

Then, the passing-operation marking portion 36 sets 'i+1', that is, '1', in the variable 'i', and determines whether or not the variable 'i' is greater than the limit for checking for the operation instructions (in a step S17). In this case, the step S17 determines whether or not the operation instruction 'Op[1]' subsequent to the operation instruction 'Op[0]' exists.

When the operation instruction 'Op[1]' subsequent to the operation instruction 'Op[0]' exists (NO in the step S17), the passing-operation marking portion 36 repeats the operations from the step S12 through the step S17 until the determination for all the operation instructions is finished (YES in the step S17), and marking is performed on all the operation instructions, execution of each of which may pass previously started execution of the other operation instruction. Then, the marking operations are finished.

After the preparatory processing for the simulation shown in FIG. 10 is finished, it is detected whether or not execution of each of the operation instructions, which have been marked by the passing-operation marking portion 36, actually passes previously started execution of the other operation instruction.

Detection as to whether or not execution of the operation instruction which has been marked by the passing-operation marking portion 36 actually passes previously started execution of the other operation instruction is performed by the passing-operation detecting portion 31 in accordance with the flowchart shown in FIG. 7. The operations of detecting occurrence of passing of the operation instructions shown in FIG. 7 are not performed for all the other operation instructions which have not been marked.

Thus, in the simulator shown in FIG. 1, it is possible to select one of the method of simulation of the processor shown in FIG. 7 and the method of simulation of the processor in which it is detected whether or not execution of the operation instruction, which has been marked by the passing-operation marking portion 36, actually passes previously started execution of the other instruction (see FIG. 7). As a result, it is possible to achieve a high-speed simulation and high-efficiency debugging of the program.

Figure 11:
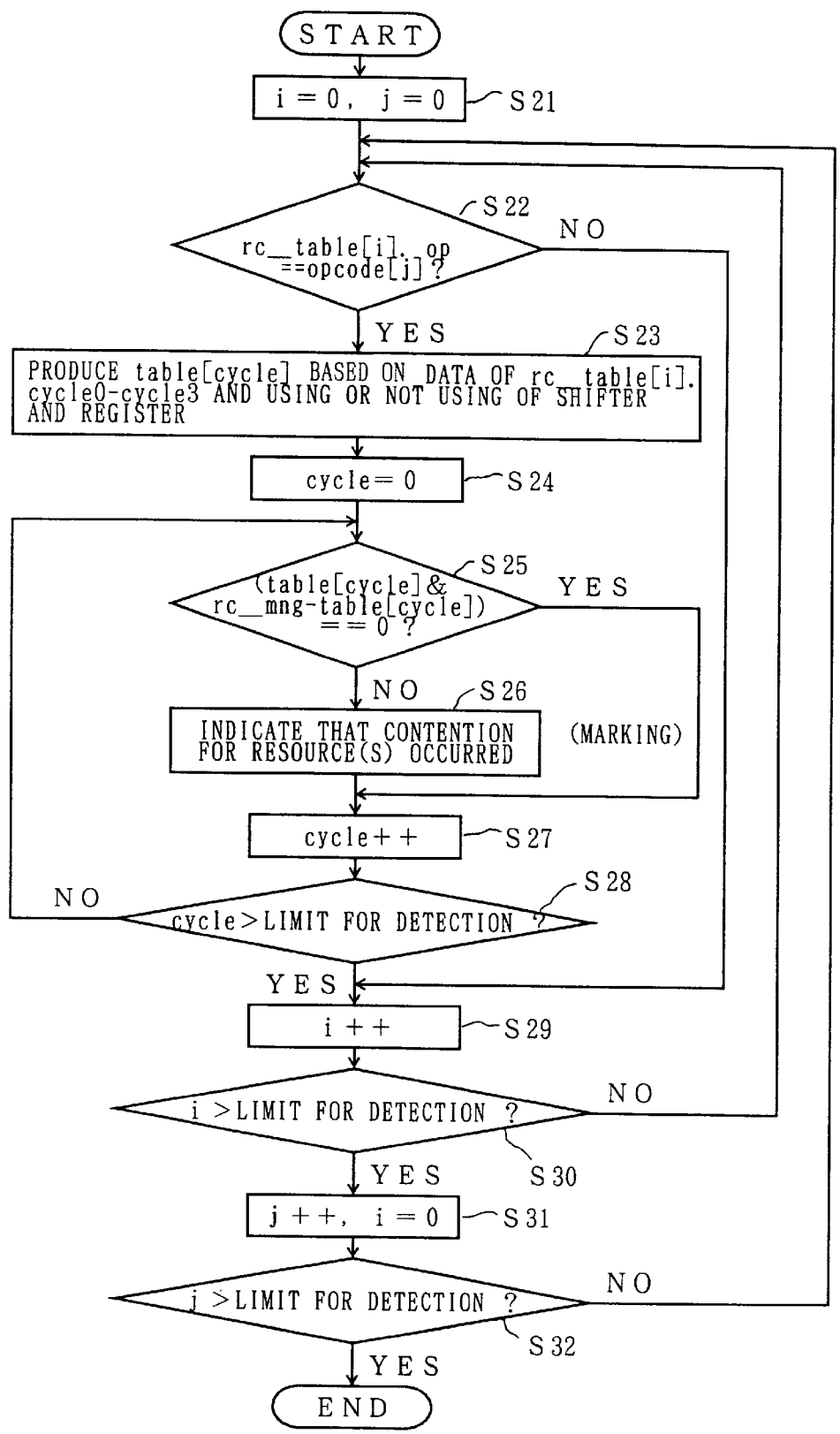
FIG. 11 shows a flowchart of operations for detecting a pipeline stall.

Further, the simulator according to the present invention, in order to enable easy detection of errors in the program, as shown in FIG. 11, detects and indicates the pipeline stall of the operation processing which occurs due to contention for the computing-unit resource.

When microcode (operation instructions) is input to the simulator shown in FIG. 1, the microcode is fetched by the operation-instruction fetching portion 5, is decoded by the operation-instruction decoding portion 4 and thus is recognized as the operation instructions.

The data reading portion 3 reads information (input data and so forth), necessary for executing the operation instructions decoded by the operation-instruction decoding portion 4, from the storage portion 6, and the operation-processing executing portion 1 executes the operation instructions.

At the same time, the pipeline-stall detecting portion 32, in order to enable easy detection of errors in the program, detects and indicates the pipeline stall of the operation process which occurs due to contention for the computing-unit resource.

The pipeline-stall detecting portion 32 sets '0' in a variable 'i', sets '0' in a variable 'j' (in a step S21), and thus performs initial setting. Then, the pipeline-stall detecting portion 32 searches for the operation instruction 'opcode[j]', to be executed, from the resource using table 34 shown in FIG. 8 after adding '1' to the variable 'i' (in a step S29) until the following equation holds (in a step S22)

$$rc\_table[i].\ op == opcode[j]$$

'rc_table[]' represents the resource using table 34 shown in FIG. 8. 'rc_table[i]. op' represents the operation instruction in the resource using table 34 shown in FIG. 8 for the variable 'i'. For example, the operation instruction for the variable 'i=0' is defined to be the addition operation instruction (ADD), the operation instruction for the variable 'i=1' is defined to be the subtraction operation instruction (SUB), and the operation instruction for the variable 'i=2' is defined to be the operation instruction of multiplication and accumulation (MAC).

The operation instruction 'opcode[j]' represents the currently noticed operation instruction decoded by the operation-instruction decoding portion 4.

Accordingly, searching until the following equation holds (in the step S22)

rc_table[i]. op==opcode[j]

means determining which of the operation instructions shown in FIG. 8 is the currently noticed operation instruction 'opcode[0]'.

For example, it is assumed that the operation instruction 'opcode[0]' is the operation instruction of multiplication and accumulation (MAC).

The pipeline-stall detecting portion 32 compares the operation instruction 'rc_table[0]' with the operation instruction 'opcode[0]'. Then, because they do not agree with one another (NO in the step S22), '1' is added to the variable 'i' (in the step S29).

In this case, the limit for checking for the variable 'i' is '2'. Therefore the answer for the question of the step S30 is NO. Then, the searching is performed on the operation instruction subsequent to the operation instruction 'rc_table[0]' in the resource using table 34 shown in FIG. 8.

The pipeline-stall detecting portion 32 compares the operation instruction 'rc_table[1]' with the operation instruction 'opcode[0]'. Then, because they do not agree with one another (NO in the step S22), '1' is added to the variable 'i' (in the step S29). Thereby, 'i=2'.

Then, the answer for the question of the step S30 is NO because the limit for checking is '2'. Then, the searching is performed on the operation instruction subsequent to the operation instruction 'rc_table[1]' in the resource using table 34 shown in FIG. 8.

The pipeline-stall detecting portion 32 compares the operation instruction 'rc_table[2]' with the operation instruction 'opcode[0]'. Then, because they (each being the multiplication operation instruction (MAC)) agree with one another (YES in the step S22), the pipeline-stall detecting portion 32 produces 'table[cycle]' using the information of 'rc_table[2]. cycle 0–cycle 3' read out from 'rc_table[2]' of the resource using table 34 shown in FIG. 8 and the information as to whether a shifter and/or a register are to be used for executing the MAC operation instruction for each cycle (in a step S23). 'rc_table[2]. cycle 0–cycle 3' represents the computing-unit resources used in the respective cycles for executing the operation instruction 'rc_table[2]'. In this case, the operation instruction 'rc_table[2]' is the MAC operation instruction, and the resources 'rc_table[2]. cycle 0–cycle 3' are the multiplier, multiplier, multiplier and adder as shown in FIG. 8. 'table[cycle]' represents a table showing the conditions as to which computing-unit resource is to be used for executing the MAC operation instruction and whether the shifter and/or register are to be used for executing the MAC operation instruction, for each cycle of the MAC operation instruction.

Then, the pipeline-stall detecting portion 32 compares the table ('table[cycle]') showing the conditions as to which resources are to be used for executing the MAC operation instruction ('rc_table[2]') for each cycle of the MAC operation instruction and the resource management table 35 shown in FIG. 9 ('rc_mng-table[cycle]'), and determines whether contention for the resource(s) (computing-unit resource, shifter and/or register) occurs for each cycle (in steps of S25, S26, S27 and S28).

In this case, the computing-unit resources used for executing the MAC instructions are the multiplier (variable 'cycle=0'), multiplier (variable 'cycle=1'), multiplier (variable 'cycle=2'), and adder (variable 'cycle=3'). Then, when these conditions are compared with the resource management table 35 shown in FIG. 9 for the current cycle, first subsequent cycle, second subsequent cycle and third subsequent cycle, it is determined that contention for the multiplier occurs in the first subsequent cycle and contention for the adder occurs in the third subsequent cycle.

As a result, the pipeline-stall detecting portion 2 indicates that the pipeline stall of the operation processing occurs due to the contention for the computing-unit resources (in a step S26).

Further, the pipeline-stall detecting portion 32 adds '1' to the variable 'i' (in a step S29) so that the variable 'i=3'. However, because the limit for checking for the variable 'i' is '2', the variable 'i' is larger than the limit for checking (YES of a step S30). Then, the variable 'i' is returned to '0' and '1' is added to the variable 'j' (in a step S31) so that the variable 'j=1'. Then, the pipeline-stall checking portion 32 determines whether the subsequent operation instruction, that is, the operation instruction 'opcode[1]' is present within the range for detecting pipeline stall or whether the operation instruction 'opcode[1]' exists (in a step S32).

For example, when it is determined that the instruction 'opcode[1]' exists (NO of the step S32), the pipeline-stall detecting portion 32 repeats the steps from the step S22 through the step S32 for the operation instruction 'opcode[1], then, updates the variable 'j', and repeats the steps from the step S22 through S32 for all the operation instruction 'opcode[ ]'. When it is determined that operation instruction 'opcode[ ]' does not exist (YES in the step S32), that is, when the search for all the operation instruction 'opcode[ ]' is finished, the processing for detecting a pipeline stall shown in FIG. 11 is finished.

When a simulation is performed in the above-described method, because the simulator according to the present invention can indicate the pipeline stall of the operation-process occurring due to the contention for the resource such as computing-unit resource or the like, debugging of the program can be efficiently executed.

However, in the simulation of the processor in the method shown in FIG. 11, although detection of the pipeline stall, which cannot be performed in simulation by the processor model in the related art, can be performed, because the operations for detecting the pipeline stall occurring due to the contention for the resource are performed on all the operation instructions (pipeline processes), degradation of the simulation efficiency (simulation speed) cannot be avoided.

Therefore, in order to improve the simulation speed, in the simulator shown in FIG. 1, it is possible to select one of the method for simulation of the processor shown in FIG. 11 in which the detecting operations are performed, and another method for simulation of a processor.

In the other method for simulation of the processor, before the simulation shown in FIG. 11 is performed, the resource-contention marking portion 37 which previously marks the operation instructions, execution of each of which may cause the contention for the resource, such as a computing-unit resource or the like, is used. Then, the pipeline-stall detecting portion 32 detects whether or not the pipeline stall occurs due to contention between the resources such as the computing-unit resources and so forth used when the marked operation instructions are executed and the resources such as the computing-unit resources and so forth used when operation instructions, execution of which is previously started, is executed.

This simulation method can be performed as a result of all the steps shown in FIG. 11 being executed by the resource-contention marking portion 37 after the contents of the step S26 in which the fact that the pipeline stall of the operation processing has occurred due to the contention for the resource(s) is indicated is changed into 'the operation instruction which uses this (these) resource(s) is marked'.

Then, the pipeline-stall detecting portion 32 detects the contention only for the resources such as the computing-unit resources and so forth which are used when the marked operation instructions are executed. The pipeline-stall detecting portion 32 does not perform the operations for detecting the contention for the resources such as the computing-unit resources and so forth which are used when the non-marked operation instructions are executed.

Thus, in the simulator according to the present invention shown in FIG. 1, it is possible to select one of the method for simulation of the processor shown in FIG. 11 and the method for simulation of the processor in which the operations for detecting the contention for the resources are performed only for the resources such as the computing-unit resources and so forth which are used when the operation instructions which have been marked by the resource-contention marking portion 37 are executed. As a result, it is possible to achieve a high-speed simulation and high-efficiency debugging of the program.

Figure 12:
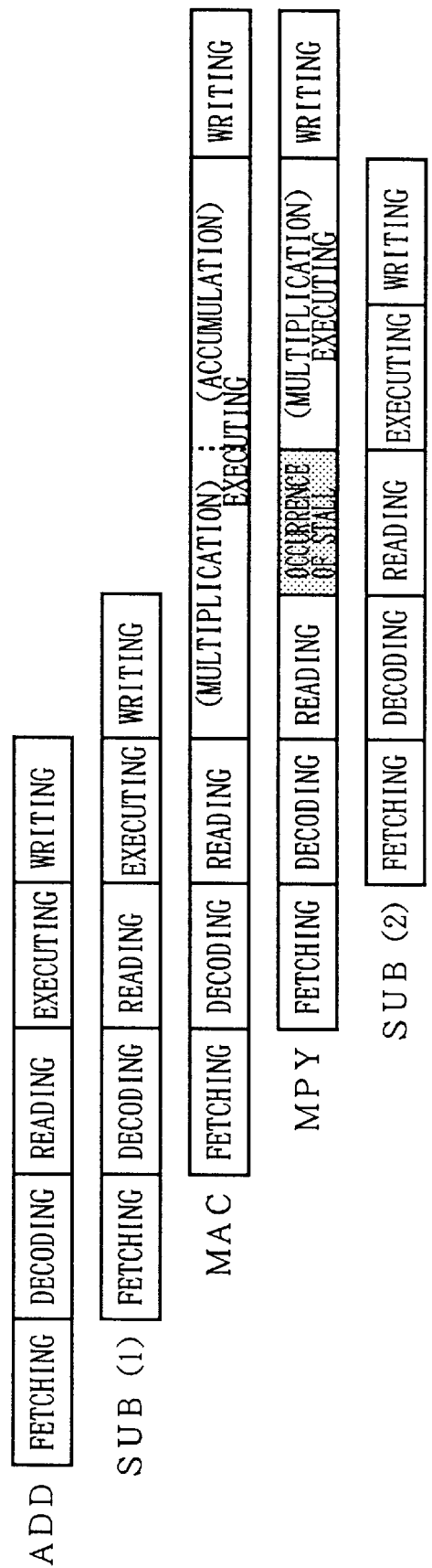
FIG. 12 shows the passing operation occurring due to occurrence of the pipeline stall.

Further, because the simulator according to the present invention shown in FIG. 1 has the passing-operation detecting portion 31 and the pipeline-stall detecting portion 32, the simulator can detect the pipeline stall due to occurrence of the contention for the resource such as the computing-unit resource or the like, and also can detect occurrence of passing of execution of the operation instruction due to occurrence of the pipeline stall, as shown in FIG. 12.

In the case of FIG. 12, the ADD operation instruction, SUB(1) operation instruction, MAC operation instruction, MPY operation instruction and SUB(2) operation instruction are fetched in the stated order. Then, in the operation process for executing the MAC operation instruction and the MPY operation instruction, as a result of occurrence of the contention for the computing-unit resource (multiplier), the pipeline stall occurs in the operation process for executing the MPY operation instruction. As a result of the pipeline stall occurring in the operation process for executing the MPY operation instruction, the timing of writing of the result of the operation process for the MPY operation instruction is delayed one cycle. As a result, execution of the SUB(2) operation instruction passes execution of the MPY operation instruction, as shown in FIG. 12. Although the timing of writing of the result of the operation process is coincident between the MAC operation instruction and the MPY operation instruction, the pipeline stall due to the contention for the writing resource does not occur because the registers to which the results of the operation processes are written are different therebetween.

Figure 13:
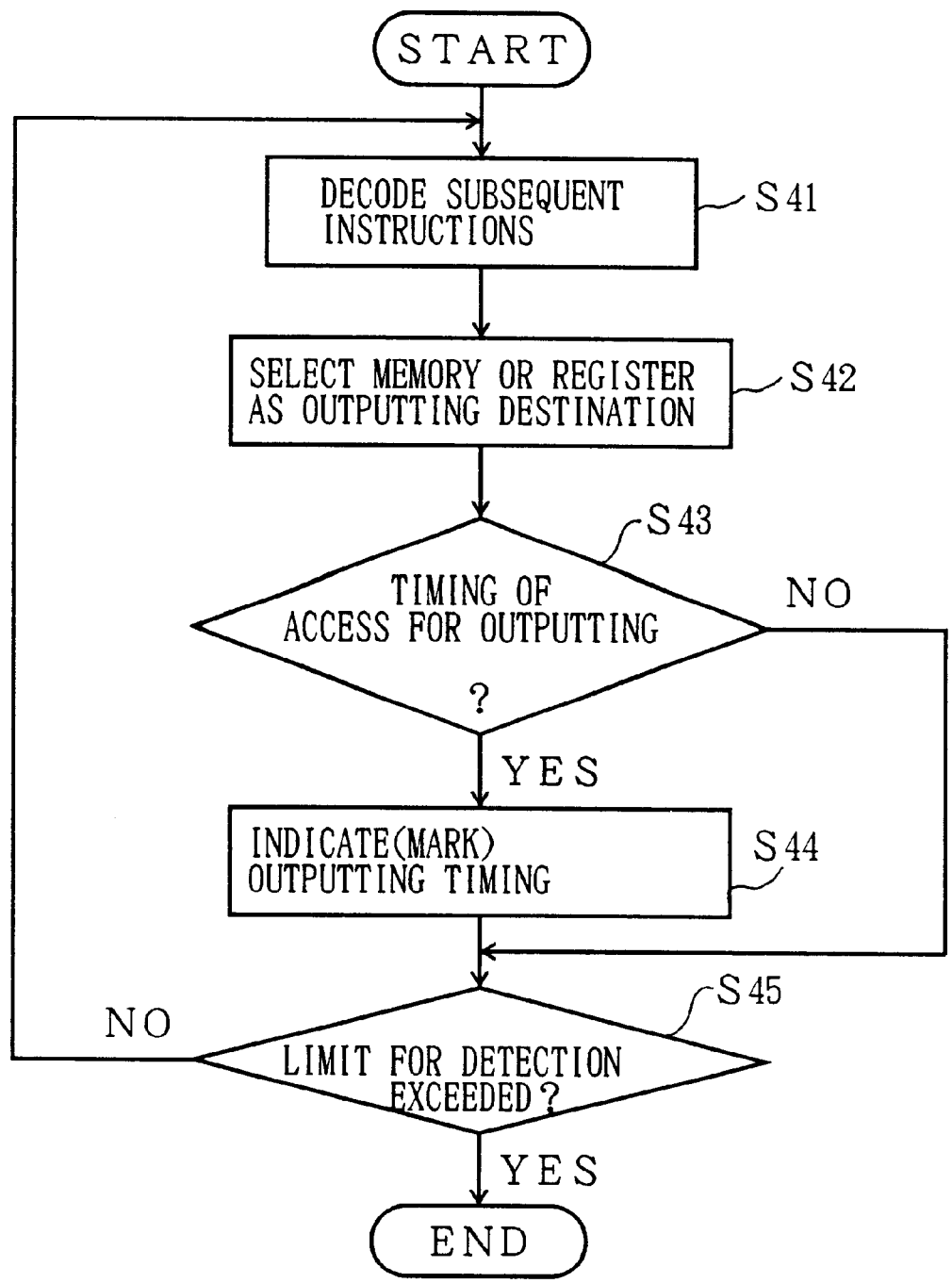
FIG. 13 shows a flowchart of operations for detecting an exceptional output timing.

Further, the simulator according to the present invention, in order to enable easy detection of errors in a program, as shown in FIG. 13, when outputting the result of the operation process, detects and indicates an exceptional outputting timing which is different from a predetermined outputting timing. The predetermined timing is defined depending on types of storage devices of the storage portion 6. For example, it is assumed that the timing of writing into a register is defined as the predetermined timing while the timings of writing into the other memory, cache and so forth are defined as the exceptional timings, respectively.

When microcode (operation instructions) is input to the simulator shown in FIG. 1, the microcode is fetched by the operation-instruction fetching portion 5, is decoded by the operation-instruction decoding portion 4 and thus is recognized as the operation instructions (in a step S41).

The data reading portion 3 reads information (input data and so forth), necessary for executing the operation instructions decoded by the operation-instruction decoding portion 4, from the storage portion 6, and the operation-process executing portion 1 executes the operation instructions.

At the same time, the exceptional-outputting-timing detecting portion 33, starts operations for detecting and indicating the exceptional outputting timing which is different from the predetermined outputting timing, in order to enable easy detection of errors in the program.

The exceptional-outputting-timing detecting portion 33 searches for a destination, to which the result of the operation process is to be output, in accordance with the operation instruction decoded by the operation-instruction decoding portion 4 (in a step S42), and determines whether or not access for outputting to the destination is performed in the exceptional outputting timing (in a step S43).

For example, when the access for outputting is access to the memory or the cache, the exceptional-outputting-timing detecting portion 33 determines that the access for outputting is performed in the exceptional outputting timing (YES in the step S43), and indicates that execution of the operation instruction including this access for outputting includes writing at the exceptional outputting timing (in a step S44).

When the access for outputting is access to the register (NO in the step S43), or after the indication performed in the step S44, the exceptional-outputting-timing detecting portion 33 repeats the steps from the step S41 through the step S45 for all the subsequent operation instructions (NO in a step S45). When no subsequent operation instructions exist (YES in the step S45), the operations for detecting and indicating the exceptional outputting timings shown in FIG. 13 are finished.

When a simulation is performed in the above-described method, because the simulator according to the present invention can indicate the exceptional outputting timing, debugging of the program can be efficiently performed.

However, although detection of the exceptional outputting timing, which cannot be performed in simulation by the processor model in the related art, can be performed in the simulation for the processor shown in FIG. 13, because the operations for detecting the exceptional outputting timing are performed for all the operation instructions (pipeline processes), degradation of simulation efficiency (speed) cannot be avoided.

Therefore, in order to improve the simulation speed, in the simulator according to the present invention shown in FIG. 1, it is possible to select one of the method of simulation for the processor shown in FIG. 13 and another method of simulation for the processor.

In the other method of simulation for the processor, before the simulation shown in FIG. 13 is performed, the exceptional-outputting-timing marking portion 38 which previously marks the operation instructions, execution of each of which results in writing at the exceptional outputting timing, is used. Then, only for the marked operation instructions, detection as to whether or not execution of each of the marked operation instructions actually results in writing at the exceptional outputting timing is performed by the exceptional-outputting-timing detecting portion 33.

This simulation method can be performed as a result of the operations performed by the exceptional-outputting-timing detecting portion 33 shown in FIG. 13 being performed by the exceptional-outputting-timing marking portion 38 after the operation of the step S44 in which the fact that writing is performed at the exceptional outputting timing is indicated is changed into the operation that 'the operation instructions, execution of each of which results in writing at the exceptional outputting timing, is marked'.

Accordingly, the exceptional-outputting-timing detecting portion 32 detects the exceptional outputting timing only for the marked operation instructions. The exceptional-outputting-timing detecting portion 32 does not perform the operations for detecting the exceptional outputting timing for the other non-marked operation instructions.

Thus, in the simulator according to the present invention shown in FIG. 1, it is possible to select one of the method of simulation for the processor shown in FIG. 13 and the other method of simulation for the processor in which the exceptional-outputting-timing detecting portion 32 detects the exceptional outputting timing only for the operation instructions marked by the exceptional-outputting. timing marking portion 38. As a result, it is possible to achieve a high-speed simulation and high-efficiency debugging of a program.

Further, the present invention is not limited to the above-described embodiment, and variations and modifications may be made without departing from the scope of the present invention.

The contents of the basic Japanese Patent Application No. 10-37720, filed on Feb. 19, 1998, are hereby incorporated by reference.

What is claimed is:

1. A simulator, which can simulate a processor which performs pipeline processing of operation instructions, and performs operation processes in parallel, a number of the operation processes being larger than a number of the pipelines, wherein said simulator simulates a passing operation in which a result of an operation process obtained from execution of an operation instruction is output earlier than a result of another operation process obtained from previously started execution of another operation instruction, the passing operation occurring due to the number of execution cycles of each operation instruction which is executed in parallel with execution of other operation instructions.

2. The simulator, according to claim 1, comprising passing-operation detecting means for detecting occurrence of the passing operation.

3. The simulator, according to claim 2, further comprising passing-operation searching means for previously searching for operation instructions, execution of each of which may cause the passing operation, before execution of the simulation, wherein said passing-operation detecting means detects whether execution of the operation instructions, which have been found by said passing-operation searching means, actually passes previously started execution of another operation instruction.

4. The simulator, according to claim 1, comprising waiting-condition detecting means for detecting a condition of waiting for enablement of an operation process, which condition occurs due to contention for a computing-unit resource.

5. The simulator, according to claim 4, further comprising resource-contention searching means for previously searching for the operation instructions, execution of each of which results in the contention for the computing-unit resource, before execution of the simulation, wherein said waiting-condition detecting means detects, whether the condition of waiting for enablement of the operation process occurs, as a result of determining whether contention occurs between the computing-unit resource which is used for execution of each of the operation instructions, which has been found by said resource-contention searching means, and the computing-unit resource which is used for previously started execution of another operation instruction.

6. The simulator, according to claim 1, comprising:

passing-operation detecting means for detecting occurrence of the passing operation;

waiting-condition detecting means for detecting a condition of waiting for enablement of an operation process, which condition occurs due to contention for a computing-unit resource;

resource memorizing means for memorizing the computing-unit resources used for respective execution cycles of the operation process for each operation instruction; and resource managing means for managing as to which computing-unit resources are used for previously started execution of other operation instructions, wherein said passing-operation detecting means and said waiting-condition detecting means detect occurrence of the passing operation and occurrence of the condition of waiting for enablement of the operation process, respectively, based on information obtained from said resource memorizing means and information obtained from said resource managing means.

7. The simulator, according to claim 1, comprising outputting-timing detecting means for detecting an outputting timing at which a result of the operation process is output, the outputting timing being different from a predetermined outputting timing.

8. The simulator, according to claim 7, further comprising outputting-timing searching means for previously searching for operation instructions, execution of each of which may result in outputting of the result of the operation process at the outputting timing, before execution of the simulation, wherein said outputting-timing detecting means detects whether the timing of outputting of the result of the operation process for each of the operation instructions which have been found by said outputting-timing searching means is actually the outputting timing.

9. A simulation method for simulating a processor which performs pipeline processing of operation instructions, starts operation processes in an order in which the operation instructions are input, performs the operation processes in parallel, and outputs results of the operation processes in an order in which the operation processes are finished, wherein said method comprises the step of a) detecting a passing operation in which a result of the operation process obtained from execution of an operation instruction is output earlier than a result of another operation process obtained from previously started execution of another operation instruction the passing operation occurring due to the number of execution cycles of each operation instruction which is executed in parallel with execution of other operation instructions.

10. The simulation method, according to claim 9, further comprising the step of b) previously searching for operation instructions, execution of each of which may cause the passing operation, before execution of the simulation, wherein said step a) detects whether execution of each of the operation instructions, which have been found by said step b), actually passes previously started execution of another operation instruction.

11. The simulation method, according to claim 9, further comprising the step of b) detecting a condition of waiting for enablement of an operation process, which condition occurs due to contention for a computing-unit resource.

12. The simulation method, according to claim 11, further comprising the step of c) previously searching for operation instructions, execution of each of which may result in contention for the computing-unit resource, before execution of the simulation, wherein said step b) detects, whether the condition of waiting for enablement of the operation process occurs, as a result of determining whether contention occurs between the computing-unit resource which is used for execution of each of the operation instructions, which have been found by said step c), and the computing-unit resource which is used for previously started execution of another operation instruction.

13. The simulation method, according to claim 11, wherein said steps a) and b), based on information obtained from resource memorizing means for memorizing the computing-unit resources used for respective execution cycles of the operation process for each operation instruction, and information obtained from resource managing means for managing as to which computing-unit resources are used for previously started execution of other operation instructions, detect occurrence of the passing operation and occurrence of the condition of waiting for enablement of the operation process, respectively.

14. The simulation method, according to claim 9, further comprising the step of b) detecting an outputting timing at which a result of the operation process is output, the outputting timing being different from a predetermined outputting timing.

15. The simulation method, according to claim 14, further comprising the step of c) previously searching for the operation instructions, execution of each of which may result in outputting of the result of the operation process at the outputting timing, before execution of the simulation, wherein said step b) detects whether the timing of outputting of the result of the operation process for each of the operation instructions which have been found by said step c) is actually the outputting timing.

16. A computer readable recording medium storing a program for causing a computer to perform simulation of a processor which performs pipeline processing of operation instructions, said program causing the computer to simulate a passing operation in which a result of the operation process obtained from execution of an operation instruction is output earlier than a result of another operation process obtained from previously started execution of another operation instruction, the passing operation occurring due to the number of execution cycles of each operation instruction which is executed in parallel with execution of other operation instructions.

17. The computer readable recording medium, according to claim 16, wherein said program causes the computer to execute the steps of:

a) detecting occurrence of the passing operation;

b) previously searching for operation instructions, execution of each of which may cause the passing operation, before execution of the simulation;

c) detecting a condition of waiting for enablement of an operation process, which condition occurs due to contention for a computing-unit resource:

d) previously searching for operation instructions, execution of each of which may result in the contention for the computing-unit resource, before execution of the simulation;

e) detecting an outputting timing at which a result of the operation process is output, the outputting timing being different from a predetermined outputting timing; and f) previously searching for operation instructions, execution of each of which may result in outputting of the result of the operation process at the outputting timing, before execution of the simulation.

* * * * *